United States Patent
Chadwick, Jr. et al.

(10) Patent No.: US 10,628,376 B2
(45) Date of Patent: *Apr. 21, 2020

(54) METHOD AND SYSTEM FOR ENUMERATING DIGITAL CIRCUITS IN A SYSTEM-ON-A-CHIP (SOC)

(71) Applicant: INTERNATIONAL BUSINESS MACHINES CORPORATION, Armonk, NY (US)

(72) Inventors: Thomas B. Chadwick, Jr., Essex Junction, VT (US); Michael R. Ouellette, Westford, VT (US); Nancy H. Pratt, Essex Junction, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/508,964

(22) Filed: Jul. 11, 2019

(65) Prior Publication Data

US 2019/0332571 A1 Oct. 31, 2019

Related U.S. Application Data

(63) Continuation of application No. 15/435,396, filed on Feb. 17, 2017, now Pat. No. 10,423,570, which is a (Continued)

(51) Int. Cl.
*G06F 15/78* (2006.01)
*G06F 13/42* (2006.01)
(Continued)

(52) U.S. Cl.
CPC ...... *G06F 15/7817* (2013.01); *G06F 13/4068* (2013.01); *G06F 13/4247* (2013.01); *G06F 13/4256* (2013.01); *G11C 19/00* (2013.01)

(58) Field of Classification Search
CPC ............. G06F 15/7817; G06F 13/4068; G06F 13/4247; G06F 13/4256
See application file for complete search history.

(56) References Cited

U.S. PATENT DOCUMENTS 4,523,292 A * 6/1985 Armer ..................... G06F 7/503
708/703
5,867,694 A * 2/1999 Billings .................... G06F 1/10
713/501

(Continued)

FOREIGN PATENT DOCUMENTS

CN 101196819 A 6/2008

OTHER PUBLICATIONS

Office Action dated Aug. 21, 2019 in related U.S. Appl. No. 16/506,427, 8 pages.

(Continued)

*Primary Examiner* — Tim T Vo
*Assistant Examiner* — Phong H Dang
(74) *Attorney, Agent, or Firm* — Alvin Borromeo; Andrew M. Calderon; Roberts Mlotkowski Safran Cole & Calderon, P.C.

(57) ABSTRACT

Methods and systems for enumerating digital circuits in a system-on-a-chip (SOC) are disclosed. The method includes incrementing an enumeration value received from a previous enumerable instance to uniquely identify an immediately adjacent enumerable instance of a plurality of enumerable instances in a daisy chain configuration.

12 Claims, 5 Drawing Sheets

Related U.S. Application Data continuation of application No. 14/040,165, filed on Sep. 27, 2013, now Pat. No. 9,672,185.

(51) Int. Cl.
  *G11C 19/00* (2006.01)
  *G06F 13/40* (2006.01)

(56) References Cited

U.S. PATENT DOCUMENTS

| | | |
|---|---|---|
| 6,389,495 B1 | 5/2002 | Larky et al. |
| 7,103,008 B2 | 9/2006 | Greenblat et al. |
| 7,735,031 B2 | 6/2010 | Chickanosky et al. |
| 7,831,742 B2 | 11/2010 | Bernardi |
| 8,122,159 B2* | 2/2012 | Monreal .............. G06F 13/4068 710/9 |
| 2002/0188781 A1* | 12/2002 | Schoch ................... G06F 13/37 710/107 |
| 2003/0196076 A1 | 10/2003 | Zabarski et al. |
| 2006/0116831 A1* | 6/2006 | Komulainen ......... H02M 7/493 702/64 |
| 2006/0230096 A1* | 10/2006 | Thendean ................. G06F 7/02 708/700 |
| 2010/0185784 A1* | 7/2010 | De Nie ............. G05B 19/0423 710/9 |
| 2012/0072626 A1* | 3/2012 | Scott ................... G06F 13/4247 710/104 |
| 2012/0311203 A1 | 12/2012 | Monks et al. |

OTHER PUBLICATIONS

Notice of Allowance dated Dec. 16, 2019 in related U.S. Appl. No. 16/506,427, 5 pages.

\* cited by examiner

METHOD AND SYSTEM FOR ENUMERATING DIGITAL CIRCUITS IN A SYSTEM-ON-A-CHIP (SOC)

FIELD OF THE INVENTION

The invention relates to digital circuits and, more particularly, to methods and systems for enumerating digital circuits in a system-on-a-chip (SOC).

BACKGROUND

It is a common occurrence in digital systems on a chip (SOC) to uniquely identify instances of digital circuits so that they can be independently addressed by the system to perform a function. The process of assigning an identifier to each addressable instance is referred to as "enumeration".

Typically, enumeration is carried out by connecting the circuits in a serial "daisy-chain", in which each circuit to be enumerated has an enumeration in port, an enumeration out port, and an enumeration control port. When the enumeration control is asserted, each circuit begins simultaneously counting. When a change in state is detected at the enumeration in port of a given instance, it stops counting. The value of the counter becomes the enumeration instance number. The enumeration output is simply the value received at the enumeration in port delayed by 1 clock-cycle. The limitation with this approach is that all of the circuits to be enumerated must be synchronous to each other, and the enumeration control signal must simultaneously arrive at all enumerable instances.

The enumeration implementation that has been in place for several generations has been designed around the assumption that all components of the system are synchronous. In this type of implementation, each enumerable instance contains an enumeration counter, which, upon assertion of a global ENABLE signal, all count in lock-step until each instance sees a "1" on the enumeration daisy-chain input, at which point the counter stops and holds its value.

However, in the next generation of ASIC technology, the industry will be moving to an IJTAG (IEEE P1687) interface, in which the control signals will no longer be global and synchronous. Instead, an asynchronous boundary crossing of the ENABLE signal will introduce some uncertainty of the arrival of the enable signals to each enumerable instance. If the existing logic were to be used, the uncertainty of the ENABLE signal could result in duplicate enumeration values or gaps in the enumeration numbering.

Accordingly, there exists a need in the art to overcome the deficiencies and limitations described hereinabove.

SUMMARY

In an aspect of the invention, a method comprises incrementing an enumeration value received from a previous enumerable instance to uniquely identify an immediately adjacent enumerable instance of a plurality of enumerable instances in a daisy chain configuration.

In an aspect of the invention, a method comprises: holding output signals of a first enumerable instance for a plurality of full cycles thereby allowing each successive enumerable instance of a plurality of enumerable instances to be instantiated with an ENABLE signal, asynchronously, without affecting incrementing of the each successive enumerable instance; providing an enumeration value at the first enumerable instance that uniquely identifies the first enumerable instance; passing the enumeration value to a next enumerable instance of the plurality of enumerable instances; and incrementing the enumeration value to uniquely identify the next enumerable instance. The enumeration value is provided by signaling protocol, independent of the ENABLE signal reaching each enumerable instance of the plurality of enumerable instances across an asynchronous boundary crossing. The enumeration value is passed through a serialized incrementer of each enumerable instance of the plurality of enumerable instances, provided in a serial connection.

In an aspect of the invention, an apparatus for sequentially enumerating units on an integrated circuit chip comprises: an input having a pulse-code modulated signal which corresponds to an enumeration value of a previous unit; an adder circuit for incrementing the pulse-code modulated signal on the input; a shift register for storing a binary 1 for each clock cycle in which an input signal is at a binary 1 level, eventually becoming a unique enumeration number, where the input to the shift register is an output of a sum register; and an output having a signal whose pulse-code modulated value corresponds to the enumeration value of a current unit, where the signal is derived from the output of the sum register at a specific point in a shift register.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of an enumerable instance (and/or serialized incrememter) which comprises the structures of the present invention. In still further embodiments, a method in a computer-aided design system is provided for generating a functional design model of the enumerable instance (and/or serialized incrememter). The method comprises generating a functional representation of the structural elements of the enumerable instance (and/or serialized incrememter).

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

Figure 1:
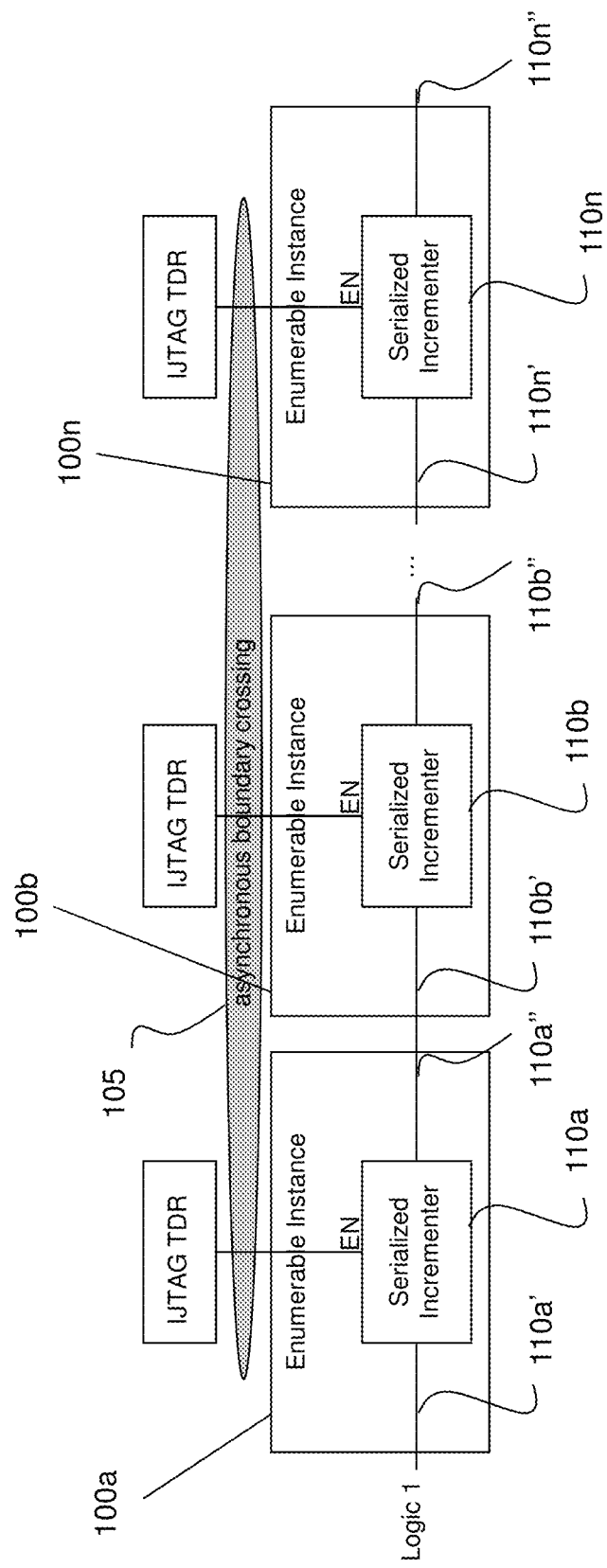
FIG. 1 shows a block diagram of a plurality of enumeration instances, each with a serialized incrementer in accordance with aspects of the present invention.

The invention relates to digital circuits and, more particularly, to methods and systems for enumerating digital circuits in a system-on-a-chip (SOC). More specifically, using a three port structure, the present invention provides an enumeration scheme, i.e., signaling protocol and control, to pass directly from one device (enumerable instance) to another device (enumerable instance) in a daisy chain configuration, without the need for a "master" controller (enumeration counter) to assign values. The present invention, for example, replaces the enumeration counter in each enumerable instance with a "serialized incrementer". In this scenario, each enumerable instance serially shifts its enumeration value along the enumeration daisy-chain. This solution is attractive because it does not require any additional signals to be passed between enumerable instances.

In embodiments, the enumeration scheme of the present invention uses a dedicated enumeration daisy-chain configuration which is not shared with any other function, and does not require a message-passing protocol for implementation. Moreover, in embodiments, the signaling protocol uses a pulse-code modulation (PCM) signal which allows the enumeration to work even if a common enable signal (IJTAG (Independent Joint Test Action Group) TDR (test data register)) reaches each instance of an enumerable instance, asynchronously. Thus, in embodiments, the present invention overcomes the requirement that the enumeration control signal arrive at all enumerable instances, simultaneously.

In more particular embodiments, the present invention provides for sequentially enumerating blocks (each with a serialized incrementer) on an integrated circuit chip without imposing severe timing or synchronization constraints. As should be understood by those of skill in the art, "enumeration" means that at the end of the method each block will have a unique, serially sequential digital identifier contained in an internal register. The present invention achieves this by replacing a conventional combination of enumeration counters in each block triggered by a global, synchronous enable and stopped by a signal from the conventional chain, with a serialized incrementer.

For example, in the present invention, a serialized incrementer of each enumerable instance (block) replaces conventional structures with an adder (sum) and a shift register which, on assertion of a start signal, generates a unique identifier as a pulse-code modulation (PCM) value. This PCM value is passed serially between enumerable instances (blocks) and serves to tell each enumerable instance (block) the unique identifier of the previous enumerable instance (block). Upon receipt of the value, the serialized incrementer of the enumerable instance (block) will increment the given value (using the adder) and will store it in the shift register.

In more specific embodiments, the signaling protocol provides the following functionality and/or advantages:

(i) each instance of the enumeration block passes an enumeration value from the enumeration out port of one instance to the enumeration in port of the next instance of the circuit in the daisy chain configuration via binary PCM;

(ii) each serialized incrementer in the daisy-chain will receive the value transmitted to it via the enumeration in port, increment that value, store that value as its own enumeration instance number, and then transmit that value out of its enumeration out port;

(iii) the first enumeration value is preceded by a "start bit", which allows the receiving serialized incrementer to know when the data arriving at its enumeration in port represents the first bit of the PCM data; and (iv) the enumeration value shall be transmitted as a least-significant bit (LSB) first. This allows for a serialized increment to take place immediately, rather than waiting for the entire enumeration value to be received at one instance before the incremented value can be transmitted to the next instance.

FIG. 1 shows a block diagram of a plurality of enumeration instances 100a, 100b, ... 100n, each having a serialized incrementer 110a, 110b ... 110n in accordance with aspects of the present invention. In this block diagram, the enumeration instances 100a, 100b, ... 100n, and hence the serialized incrementers 110a, 110b ... 110n, are provided in a serial connection (daisy chain configuration), with an IJTAG TDR signal provided to each enumeration instance 100a, 100b, ... 100n, across an asynchronous boundary crossing 105.

In embodiments, each of the plurality of enumeration instances 100a, 100b, ... 100n (and serialized incrementers 110a, 110b ... 110n) includes a respective input 110a', 110b' ... 110n' (e.g., ENUMIN port) and a respective output 110a", 110b" ... 110n" (e.g., ENUMOUT port). In embodiments, the IJTAG TDR signals are launched in a same cycle, e.g., provided at a certain frequency, e.g., 25 MHz. Due to the asynchronous boundary crossing 105, each enumeration instance 100a, 100b, ... 100n can effectively receive their respective IJTAG TDR signals at a different time or cycle.

In the implementation of FIG. 1, though, an enumeration value for each enumeration instance is passed in via the ENUMIN port, and the enumeration value for each enumeration instance is passed out via the ENUMOUT port of each serialized incrementer 110a, 110b ... 110n. More specifically, each instance of the enumeration block (i.e., enumeration instances 100a, 100b, ... 100n) passes an enumeration value from the enumeration out port of one instance to the enumeration in port of the next instance in a daisy chain configuration via binary PCM. As the enumeration value is passed into each of the serialized incrementers 110a, 110b ... 110n, an increment is performed by way of ripple-carry-add-type logic. In this way, each serialized incrementer 110a, 110b ... 110n in the daisy-chain will receive the value transmitted to it via the enumeration in port, increment that value, store that value as its own enumeration instance number, and then transmit that value out of its enumeration out port to the next instance.

In embodiments, the enumeration value is a PCM propagated as a signal of fixed length, such that the execution time is of order O(N+M), where N is the number of instances and M is the number of bits in the enumeration value. In embodiments, N and M are related as N=2^M, so the execution time can also be expressed as O(N+log 2(N)).

Figure 2:
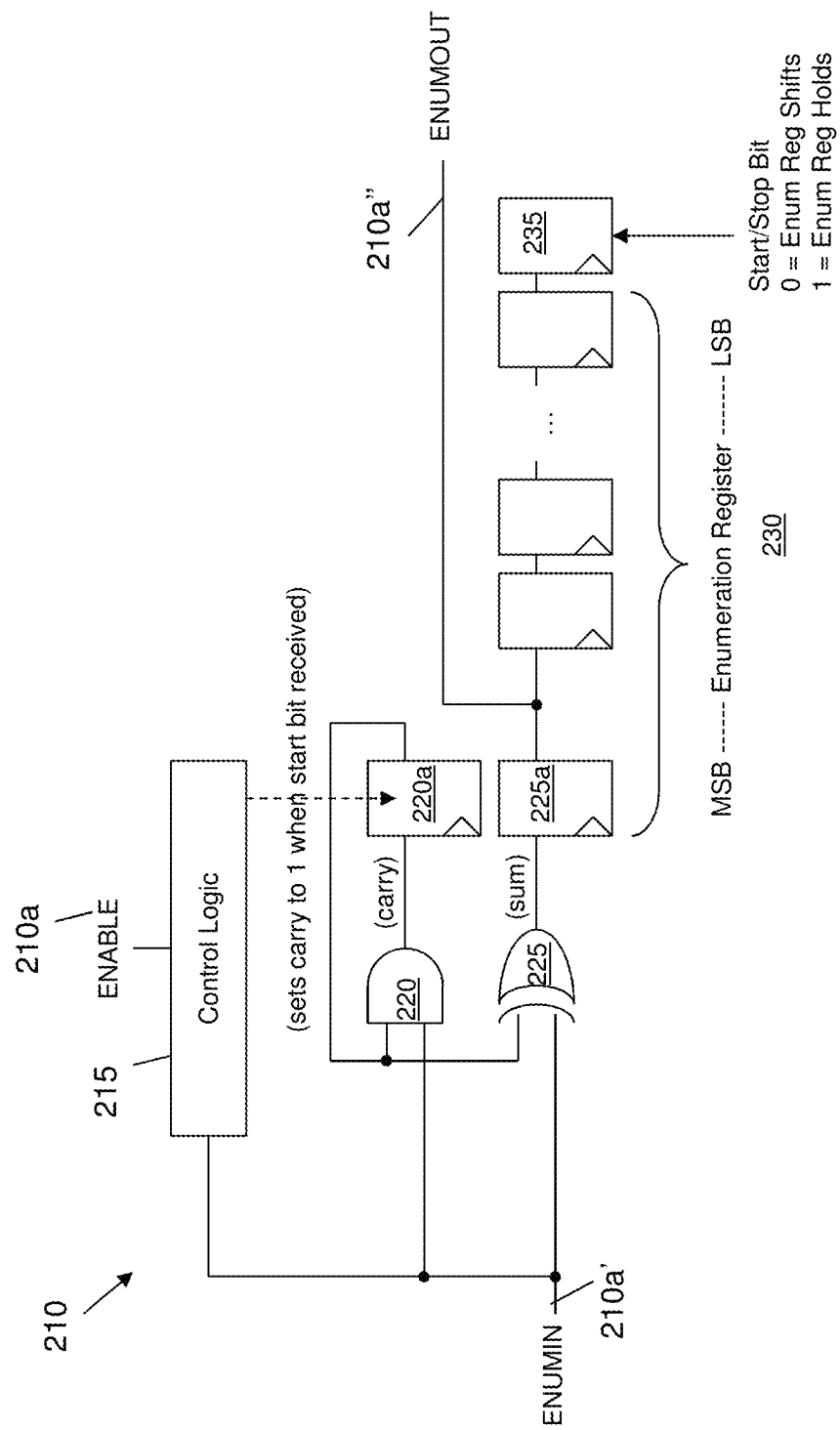
FIG. 2 shows a logic diagram of a serialized incrementer in accordance with aspects of the present invention.

FIG. 2 shows a logic diagram of a serialized incrementer in accordance with aspects of the present invention. More specifically, the serialized incrementer 210 includes an ENABLE signal 210a, an input (e.g., ENUMIN port) 210a' and an output (e.g., ENUMOUT port) 210a". The ENABLE signal 210a is provided to control logic 215, which provides logic to a carry register 220a. The serialized incrementer 210 further includes an AND gate 220 which provides a value, e.g., 1 or 0, to the carry register 220a, and an XOR gate 225 which provides an incremented sum value to a sum register 225a. As should be understood by those of skill in the art, the XOR gate 225 will generate a value of 1 when the input values are 0 and 1 or 1 and 0 (as received from the carry register 220a and ENUMIN port 210a'); whereas the XOR gate 225 will generate a value of 0 when the input values are 0 and 0 or 1 and 1 (as received from the carry register 220a and ENUMIN port 210a').

In embodiments, the sum register 225a is part of an enumeration register 230, which also includes a most significant bit register (MSB) and a least significant bit register (LSB). As should be understood by those of skill in the art, the enumeration register comprises a plurality of shift registers, which can be incremented in accordance with aspects of the present invention to provide a unique identification of the enumeration instance. By way of example, the shift register (e.g., enumeration register 230) stores a binary 1 for each clock cycle in which the input signal is at a binary 1 level, eventually becoming a unique enumeration number for the enumerable instance. A start/stop bit register 235 will hold or shift the enumeration register 230, depending on its value. For example, a value of 0 will shift the enumeration register 230 and a value of 1 will hold the enumeration register 230.

In operation, the enumeration register 230, the start/stop register 235, and the carry register 220a are initialized to a value of 0. The ENUMIN port 210a is assumed to be quiescently 0. At the beginning of the cycle, the sum value in the sum register 225a will be quiescently 0. When a value of 1 is first received at the ENUMIN port 210a, it is interpreted as the start bit, and the control logic 215 will load the carry register 220a with a value of 1. The enumeration register 230 will hold this value. The start bit will be transferred to the most-significant bit (MSB) register, e.g., sum register 225a of the enumeration register 230. This will also result in the start bit being transmitted to the next circuit (serialized incrementer) in the enumeration daisy-chain via the ENUMOUT port 210b with a 1 clock cycle delay.

In the next cycle, the LSB of the incoming enumeration value will be received. New carry and sum values will be computed, and will be stored in the carry register 220a and MSB registers 230, as well as transmitted to the ENUMOUT port 210b. Since the carry register 220a will have been set to a value of 1 upon receipt of the start bit, the resultant effect will be to initiate an increment function on the LSB-first PCM value arriving at the ENUMIN port 210a. In this way, it is possible to incrementally shift a value down the chain of registers in the enumeration register 230 such that the LSB will toggle to the next bit if a value of 1 is detected, whereas, the LSB will not toggle when the value is 0. This process will continue on subsequent clock cycles, with the incremented enumeration value being shifted along the enumeration register 230, as well as transmitted out of the ENUMOUT port 210b. When the start bit reaches the start/stop register 235, control logic will stop shifting of data in the enumeration register 230, causing the enumeration of this circuit to cease and the enumeration register 230 to hold its value.

Thus, as should now be understood by those of skill in the art, an input has a pulse-code modulated signal which corresponds to an enumeration value of a previous enumerable instance. An adder circuit, e.g., XOR gate 225, increments the pulse-code modulated signal on the input. A shift register 230 stores a binary 1 for each clock cycle in which an input signal is at a binary 1 level, eventually becoming a unique enumeration value, where the input to the shift register is an output of the sum register 225. An output having a signal whose pulse-code modulated value corresponds to the enumeration value of a current unit, where the signal is derived from the output of the sum register at a specific point in a shift register. Accordingly, by implementing the serialized incrementer, it is now possible to increment an enumerable instance 1 bit higher than the previous enumerable instance (by adding a value of 1 to the previous value) such that each block (i.e., enumerable instance) will have a unique, serially sequential digital identifier contained in an internal register.

Figure 3:
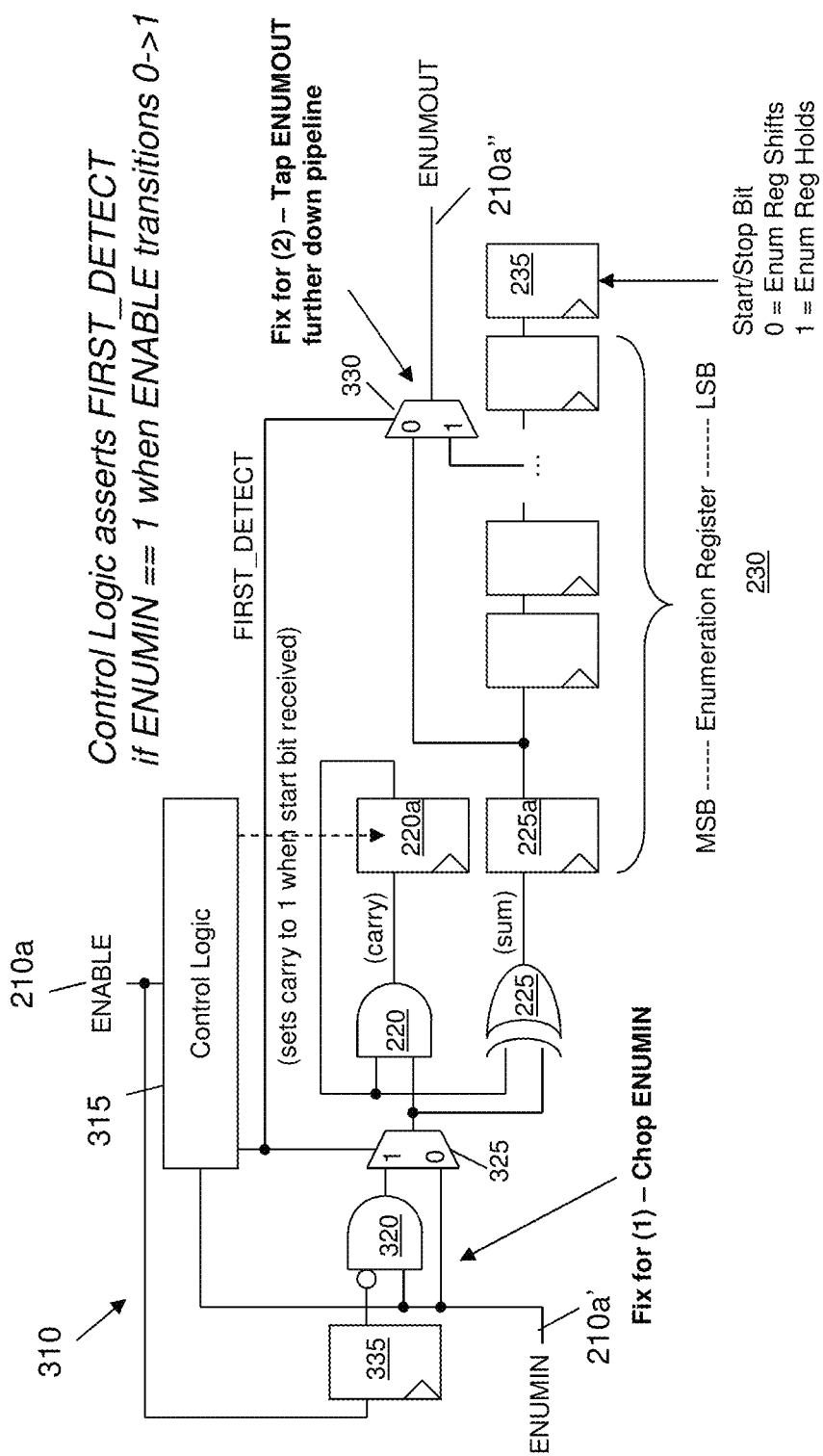
FIG. 3 shows a logic diagram of a serialized incrementer in accordance with another aspect of the present invention.

FIG. 3 shows a logic diagram of a serialized incrementer in accordance with additional aspects of the present invention. More specifically, the serialized incrementer 310 includes an ENABLE signal 210a, an input (e.g., ENUMIN port) 210a' and an output (e.g., ENUMOUT port) 210a".

The ENABLE signal 210a is provided to control logic 315, which provides logic to a carry register 220a. The serialized incrementer 210 further includes an AND gate 220 which provides a value, e.g., 1 or 0, to the carry register 220a, and an XOR gate 225 which provides an incremented sum value to a sum register 225a, as described already herein. In embodiments, the sum register 225a is part of the enumeration register 230, which also includes a most significant bit register (MSB) and a least significant bit register (LSB). A start/stop bit register 235 will hold or shift the enumeration register 230 depending on its value, as previously described with regard to FIG. 2.

In operation, the ENABLE signal 210a is asserted to the control logic 315 and shift register 335. At initiation of the first enumerable instance, e.g., at the first cycle, a start signal, e.g., value of 1, is asserted at the ENUMIN port 210a'. This start signal, e.g., value of 1, is a "start bit" which allows the serialized incrementer 310 to know when the data arriving at its enumeration in port represents the first bit of the PCM data. The start signal, e.g., value of 1, is propagated to an AND gate 320, control logic 315 and first MUX 325. In response to the start signal, and when the ENABLE signal 210a transitions from a value of 0 to 1, the control logic 315 will assert a FIRST_DETECT signal. The FIRST_DETECT signal will then drive the second MUX 330 to a value of 1 which, in turn, will hold the output of the ENUMOUT 210a" for two additional cycles, e.g., to hold the output during three full cycles, allowing each enumerable instance to be instantiated with an ENABLE signal, asynchronously, without affecting the incrementing of successive enumerable instances. Thus, in this way, the ENABLE signal, e.g., IJTAG TDR can reach each instance of an enumerable instance, asynchronously, without affecting the incrementing of successive enumerable instances; that is, by waiting a full three cycles, all downstream enumerable instances will be initiated by the ENABLE signal, even when crossing an asynchronous boundary. Thus, in embodiments, the present invention overcomes the requirement that the ENABLE signal (control signal) must arrive at all enumerable instances, simultaneously. Thereafter, the operation continues with respect to that described in FIG. 2.

In embodiments, it is preferred that each enumerable instance comprises the serialized incrementer 310. In this way, each enumerable instance, stored in a library, can be the same. However, the present invention is not limited to such an embodiment and, it is further contemplated that the first enumerable instance comprises the serialized incrementer 310 and all subsequent enumerable instances of the circuit comprise the serialized incrementer 210 or any combination of serialized incrementer 210/310. In this way, by using the serialized incrementer 310 with the first enumerable instance, it is possible to accommodate the ENABLE signal (control signal) can arrive asynchronously while still incrementing successive enumerable instances in the manner described herein.

Figure 4:
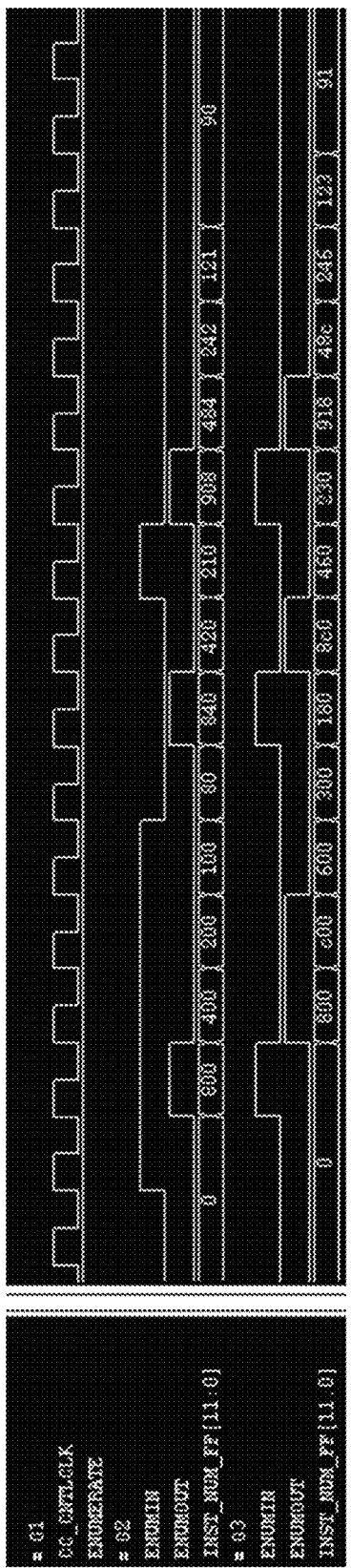
FIG. 4 shows a simulation waveform generated by using the serialized incrementer of the present invention.

FIG. 4 shows a simulation waveform generated by using the serialized incrementer of the present invention. More specifically, the waveform illustrates one cycle of latency between start times of increment operation of one instance followed by another. In FIG. 4, the serial incrementing starts in the 144th instance, followed one cycle later by the start of the serial incrementing in the 145th instance. Thus, the simulation waveform illustrates what happens at the ENUMIN and ENUMOUT pins of the 144th and 145th enumerated instances, during the enumeration operation.

For example, the value being shifted in at the 1st ENUMIN reflects a start bit of "1", followed by the binary value of "143". LSB comes out right after the one-cycle start bit. The value of "143" reflects the enumeration value of a previous instance, for which waveforms are not shown. The 1st ENUMOUT reflects a start bit of "1", followed by the binary value of "144" (again LSB first). The value being shifted in at the 2nd ENUMIN reflects a start bit of "1", followed by the binary value of "144" (again LSB first). The 2nd ENUMOUT reflects a start bit of "1", followed by the binary value of "145" (again LSB first).

Figure 5:
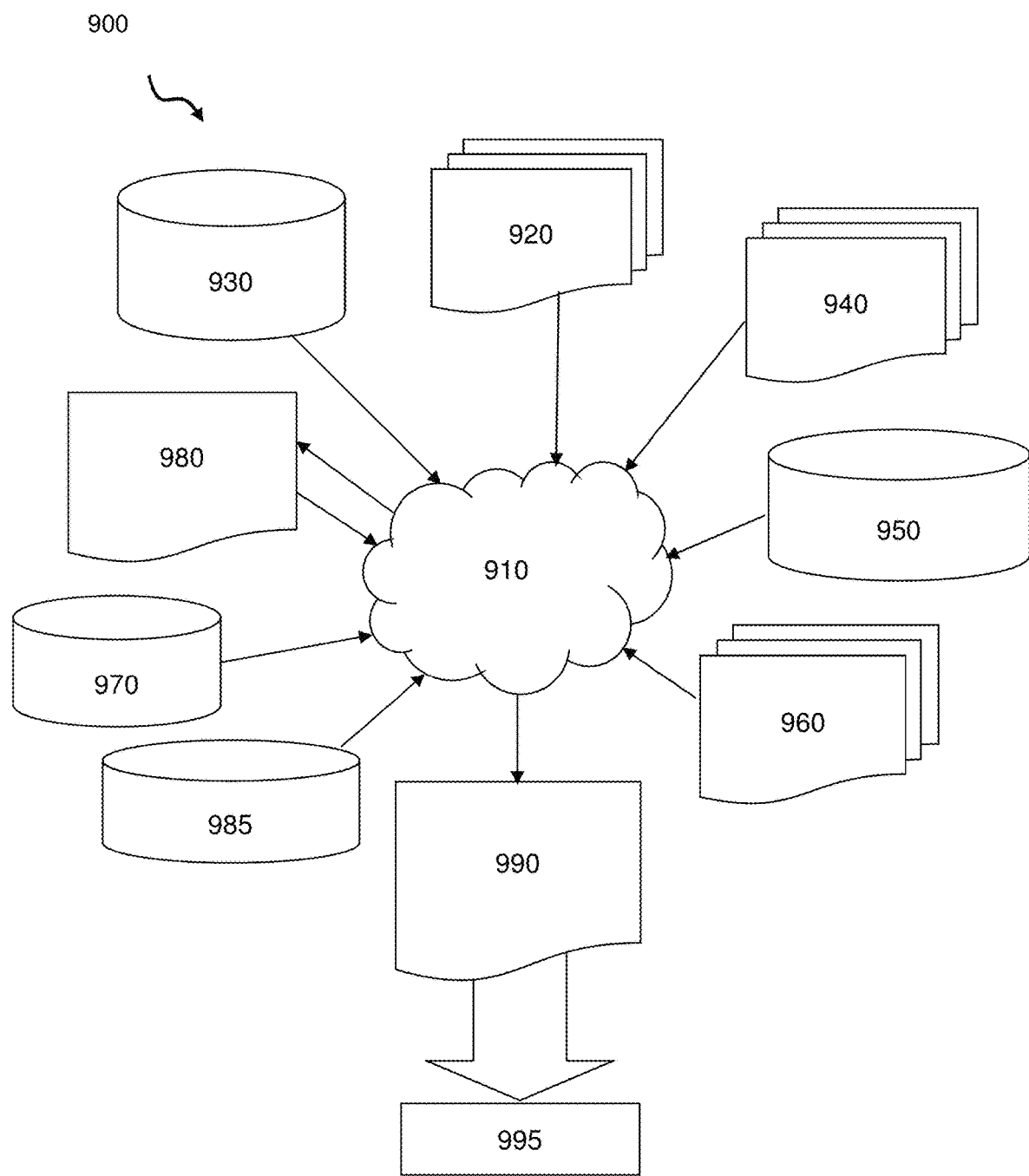
FIG. 5 is a flow diagram of a design process used in semiconductor design, manufacture, and/or test.

FIG. 5 is a flow diagram of a design process used in semiconductor design, manufacture, and/or test. FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-3. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g., e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-3. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-3 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-3. In one embodiment, design structure 990 may comprise a compiled, executable HDL simulation model that functionally simulates the devices shown in FIGS. 1-3.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-3. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An apparatus for sequentially enumerating units on an integrated circuit chip comprising:
    an adder circuit for incrementing a pulse-code modulated signal corresponding to an enumeration value of a previous unit;
    an AND gate which provides a value to a carry register based on the pulse-code modulated signal and an output of the carry register; and
    a shift register for storing a binary 1 for each clock cycle in which an input signal is at a binary 1 level, eventually becoming a unique enumeration number, where the input to the shift register is an output of a sum register.

2. The apparatus of claim 1, further comprising a control logic which receives an ENABLE signal to provide logic to the carry register.

3. The apparatus of claim 2, wherein the control logic also receives the pulse-code modulated signal and outputs a value of 1 to the carry register in response to the pulse-code modulated signal having the value of 1.

4. The apparatus of claim 3, wherein the carry register is loaded with the value of 1 in response to the pulse-code modulated signal having the value of 1.

5. The apparatus of claim 1, wherein the adder circuit comprises an XOR gate which receives the pulse-code modulated signal and the output of the carry register and outputs the incremented pulse-code modulated signal.

6. The apparatus of claim 5, wherein the sum register receives the incremented pulse-code modulated signal.

7. The apparatus of claim 1, further comprising a start-stop register which is initialized to a value of 0 and holds an output of the shift register in response to the pulse-code modulated signal having a value of 1.

8. The apparatus of claim 1, further comprising a start-stop register which is initialized to a value of 0 and shifts an output of the shift register in response to the pulse-code modulated signal having a value of 0.

9. The apparatus of claim 1, wherein the shift register comprises a plurality of registers in a daisy-chain configuration.

10. The apparatus of claim 1, wherein the sum register is a most significant bit (MSB) register.

11. The apparatus of claim 1, wherein the shift register includes a least significant bit register (LSB).

12. The apparatus of claim 11, wherein the carry register is initialized to a value of 0.

* * * * *